US006967533B2

(12) United States Patent
Vilhonen et al.

(10) Patent No.: US 6,967,533 B2
(45) Date of Patent: Nov. 22, 2005

(54) ARRANGEMENT FOR SAVING ENERGY IN TRANSMITTER

(75) Inventors: Sami Vilhonen, Turku (FI); Sami Vaara, Turku (FI)

(73) Assignee: Nokia Corporation, Espoo (FI)

(*) Notice: Subject to any disclaimer, the term of this patent is extended or adjusted under 35 U.S.C. 154(b) by 28 days.

(21) Appl. No.: 10/816,516

(22) Filed: Apr. 1, 2004

(65) Prior Publication Data
US 2004/0257161 A1 Dec. 23, 2004

(30) Foreign Application Priority Data
Jun. 19, 2003 (FI) ................................. 20030926

(51) Int. Cl.[7] ............................................. H03F 3/45
(52) U.S. Cl. .................. 330/254; 330/129; 330/133
(58) Field of Search .............................. 330/254, 285, 330/133, 134, 279, 129

(56) References Cited

U.S. PATENT DOCUMENTS

| 3,968,453 | A | * | 7/1976 | Hongu et al. ............... 330/254 |
| 5,432,473 | A | * | 7/1995 | Mattila et al. .............. 330/133 |
| 5,625,322 | A | * | 4/1997 | Gourgue et al. ............ 330/129 |
| 5,880,631 | A | * | 3/1999 | Sahota ....................... 330/254 |
| 6,107,878 | A | * | 8/2000 | Black .......................... 330/129 |
| 6,339,361 | B1 | | 1/2002 | Khesbak et al. ............ 330/285 |
| 6,532,473 | B2 | * | 3/2003 | Niazi et al. ............. 707/103 X |

* cited by examiner

Primary Examiner—Lam T. Mai
(74) Attorney, Agent, or Firm—Harrington & Smith, LLP

(57) ABSTRACT

An arrangement for saving energy in a radio device transmitter and a radio device. The steady currents of the transmitter amplifiers are made dependent on the transmitting power for reducing the losses of the amplifiers. The VGA (400) comprises at least one main differential pair (Q41–Q42; Q43–Q44) for controlling the gain and a bias differential pair (Q47–Q48) for controlling said steady currents. These pairs are steered by the one and the same voltage ($\Delta V$), in which case the output current ($I_{b1}$; $I_{b2}$) of the bias differential pair changes in the same way as the output current ($i_{o1}$; $i_{o2}$) of the main differential pair when the gain is readjusted. The output current of the bias differential pair is used as a bias current of the transmitter amplifiers, i.e. as a current that determines the steady currents of the amplifiers. Because the values of the steady currents of the amplifiers track accurately the value of the gain, when this is changed, the steady currents are always so low as the transmitting power necessarily requires, at a given time, wherein the amount of needless losses, from the transmitting operation's point of view, is small. Said differential pairs are placed on one and the same substrate, in order to the control to function accurately in a wide dynamic range.

8 Claims, 3 Drawing Sheets

ARRANGEMENT FOR SAVING ENERGY IN TRANSMITTER

The invention relates to an arrangement for saving energy in a radio device transmitter by means of controlling current consumption. The invention also relates to a radio device having an arrangement according to it.

BACKGROUND OF THE INVENTION

Small-sized portable radio devices, as mobile phones, should consume so little energy as possible to lengthen the use time of the battery and to avoid heating problems. Furnishing a phone with plurality of additional activities contributes to giving rise to energy saving. Most important objects, from the point of energy saving, are naturally those, whose energy consumption is relatively high. The radio frequency amplifiers of the transmitter are such objects, especially. Energy losses inevitably occur in the amplifiers. If the transmitting power of a transmitter would be constant, it would be easy to design the amplifiers so that the energy losses would be relatively low. However, in mobile terminals the transmitting power is changeble, because it is intentionally tried to be set to a value that is just sufficient. Unnecessary high transmitting powers cause rise of noise level in a radio network, which is avoided, of course. The power control range may be even 50 dB. The problem in that case is keeping the dissipation power down when using low transmitting powers.

FIG. 1 shows an example of a radio transmitter as a block diagram and of a principle, known as such, how to affect the dissipation power of the amplifiers. The transmitter comprises, listed in the propagation direction of the signal to be transmitted, a modulator MOD, a variable gain amplifier VGA, a driver amplifier DRA, a matching filter MFI, a power amplifier PA, an antenna filter AFI of the transmitting side and an antenna ANT. Abbreviation VGA will be used for the said variable gain amplifier in this description as well as in the claims for briefness and clarity. The analogous converted parts I and Q of the signal to be transmitted and a carrier LO are led to the quadrature type modulator from a local oscillator. The VGA is joined to the bus of the radio device, through which bus the gain of the VGA and thus the transmitting power of the whole transmitter are set programmably. The power amplifier PA has a separate driver amplifier DRA, because placing the driver amplifier in the same integrated circuit with the power amplifier would result in temperature problems in the driver amplifier. The output power of the driver amplifier is already remarkably high, and should thus be taken into account in the energy saving arrangements.

The dissipation powers of the driver and power amplifiers are affected through their steady currents in FIG. 1. When the input signal level of the driver amplifier is at its height, the steady currents must be high enough so that it is possible to rise the output power of the power amplifier to a specified maximum value. When the level of the input signal lowers from its maximum value, the steady currents can be unchanged from the output power's point of view. However, in principle this means unnecessary losses inside the amplifiers. By lowering the steady currents these losses are reduced at the same time, because the products of the current and voltage of the internal components of an amplifier are reduced. The lower the level of the input signal is, the more there is room for decreasing the steady currents. The output power of the transmitter is determined by the gain of the VGA, as mentioned above. The VGA then indirectly has information about the transmitting power. This matter is utilized by including a bias current source 130 of the driver and power amplifiers into the VGA, the input signal of which source is the same as the gain control voltage set through the bus. When the gain is increasing, a bias current $I_{bias}$ becomes higher and vice versa. Both the driver amplifier DRA and the power amplifier PA have a bias current of their own, which bias current determines the steady current in the amplifier.

FIG. 2 shows an example of variable gain amplifier VGA, including a known bias current source. The VGA 200 comprises an amplifier proper 210, control circuit 220 thereof and a bias current source 230. The amplifier proper 210 has a bipolar differential pair Q21–Q22. The emitters of these transistors are connected to a controllable signal current source 211, the second current terminal of which being connected to the ground. The collector of the first transistor Q21 is directly connected to the supply voltage $V_s$ and the collector of the second transistor Q22 is connected to a driver amplifier DRA, which is not shown in FIG. 2. When the base currents of the transistors are not taken into account, the current $i_{in}$ of the current source 211 is the sum of the first collector current $i_1$ and the second collector current $i_{out}$. The signal current source 211 is controlled by the input signal $v_{in}$ of the amplifier. The second collector current $i_{out}$ is at the same time the output signal of the amplifier. The base of the first transistor Q21 is connected to a reference voltage $V_{r1}$ through a resistor R21 and the base of the second transistor Q22 is connected to the output of the control circuit 220 through a resistor R22.

The control circuit 220 comprises an operational amplifier A21, a feedback resistor R23 thereof and a second controllable current source 221. The non-inverting input of the operational amplifier is connected to a reference voltage $V_{r2}$ and the current source 221 is connected from the inverting input to the ground. The current source is controlled externally by the gain control signal $V_G$. The direction of the source current $I_{GT}$ is towards the ground, in which case the output voltage of the control circuit $V_{GT} = V_{r2} + R23 \cdot I_{GT} = V_{r2} + aV_G$, where a is a constant. When the output voltage of the control circuit is enhanced by the control signal $V_G$, the current $i_{out}$ of the second transistor is enhanced and the current $i_1$ of the first transistor is reduced the same amount. The current $i_{in}$ remains unchanged, whereupon the current gain $G_I$ becomes greater. The maximum value of the current gain is one, in which case the current $i_{in}$ of the current source 221 flows wholly through the second transistor Q22. By means of the control circuit also a temperature compensation of the gain can be implemented.

The bias current source 230 comprises an operational amplifier A22, to the non-inverting input of which the above-mentioned gain control voltage $V_G$ is fed. The output of the operational amplifier is connected to the gate of a n-channel fet Qb, and the source of the fet Qb is connected to the signal ground through a resistor R24. From the source of the fet there is also a feedback to the inverting input of the operational amplifier, which feedback forces the voltage over the resistor being equal to the control voltage $V_G$. Thus the current $I_D$ flowing in the channel of the fet is equal to $V_G/R24$. The drain of the fet Qb is connected to the output of the bias current source 230. Prerequisite of the fet current naturally is that the output is connected to the supply voltage through some way. Between the same output and the ground there is further connected a constant current source 231, the current of which is $I_{co}$. The output current, or the bias current $I_{bias}$, then is the sum of the currents $I_D$ and $I_{co}$. In FIG. 2 occurs only one bias current. The bias current is divided between the driver and power amplifiers or it controls a circuit that produces two bias currents. The current $I_{co}$ is relatively low and it secures that the bias current never drops quite close to the zero. A very low bias current would cause the amplifier to change unstable.

In this description the reference "R" means both a resistance and a resistor (component), the resistance of which is R. The term "differential pair" refers in this description and in the claims to two transistors, the emitters of which are connected together. The total emitter current is then divided between the transistors in a certain ratio depending on the control led to the bases.

A flaw of the above-described arrangement is, that the control of the losses of the driver amplifier and power amplifier is far from an optimal control. This is due to the fact that the bias current's dependence on the transmitter gain is very non-linear. Let us suppose an exemplary situation, that the transmitting power has to be dropped 40 dB from its maximum value. This corresponds to decreasing the current gain $G_I$ to the hundredth part. In the VGA of FIG. 2 the decreasing of the current gain to the hundredth part, from the value 0.99 to the value 0.01, takes place when the control voltage $V_G$ is lowered e.g. to the half, in which case the ratio of the control voltage is two. An accurate value depends on detailed implementation of the circuit, mainly on the selection of the reference voltages. In any case the ratio of the control voltage is much smaller than the ratio of the gain. The bias current of the driver and power amplifiers and therefore also the steady currents of these amplifiers decrease about in the same ratio as the control voltage $V_G$. In the above-mentioned example the steady currents decrease to the half, altough there would be room for almost double decreasing, e.g. about to the hundredth parts of the original values. Correspondingly one half of the losses of the amplifiers fails to cut.

SUMMARY OF THE INVENTION

An object of the invention is to reduce said disadvantage related to the prior art. An arrangement according to the invention is characterized in that which is specified in the independent claim 1. A radio device according to the invention is characterized in that which is specified in the independent claim 8. Some preferred embodiments of the invention are specified in the dependent claims.

The basic idea of the invention is as follows: The steady currents of the transmitter amplifiers are made dependent on the transmitting power for reducing the losses of said amplifiers. The VGA comprises at least one main differential pair for controlling the gain and a bias differential pair for controlling said steady currents. These pairs are steered by the one and the same voltage, in which case the output current of the bias differential pair changes in the same way as the output current of the main differential pair when the gain is readjusted. The output current of the bias differential pair is used as a bias current of the transmitter amplifiers, e.g. as a current, which determines the steady currents of the amplifiers. Said differential pairs are placed on one and the same substrate.

An advantage of the invention is that needless losses, from the transmitting operation point of view, are avoided better than in the known transmitter structures. This is due to that the values of the steady currents of the amplifiers track accurately the value of the gain, when the gain is changed. Thus the steady currents are always as low as the transmitting power necessarily presumes, at a given time. Another advantage of the invention is that the prevention of needless losses functions accurately also when the dynamics of the amplifiers is wide, i.e. when the control range of the gain is large. This is due to that the bias differential pair controlling the steady currents and the main differential pair/pairs are accurately similar functionally, because they are formed in one and the same manufacturing process on one and the same substrate.

BRIEF DESCRIPTION OF THE DRAWINGS

The invention will now be described in detail. Reference will be made to the accompanying drawings wherein.

DETAILED DESCRIPTION OF THE INVENTION

Figure 1:
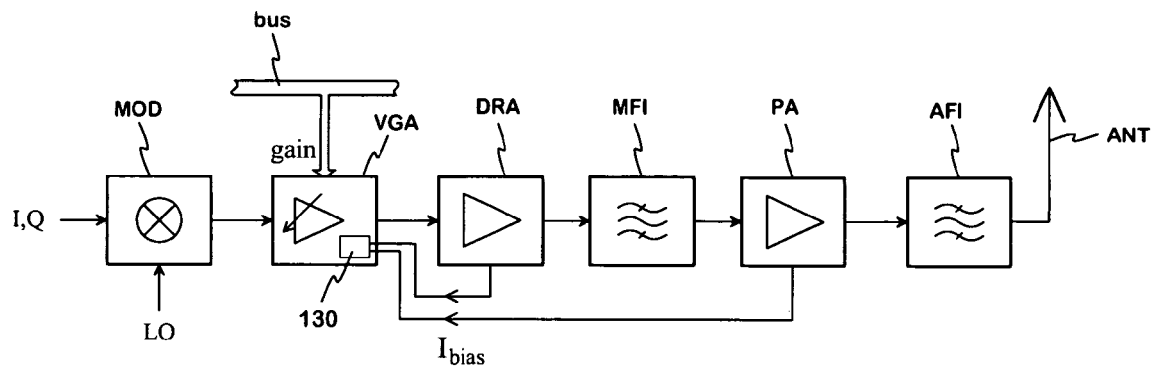
FIG. 1 presents a transmitter of a radio device as a block diagram.
Figure 2:
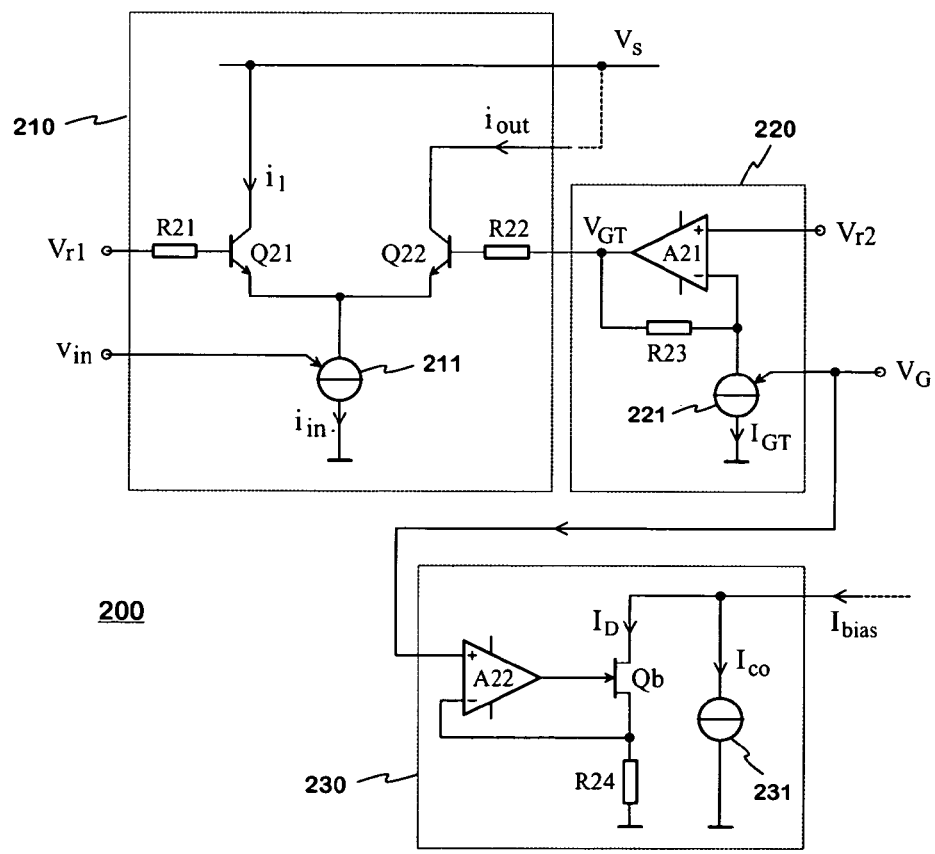
FIG. 2 presents an example of a VGA in accordance with the prior art with a bias current source for the transmitter amplifiers.
Figure 3:
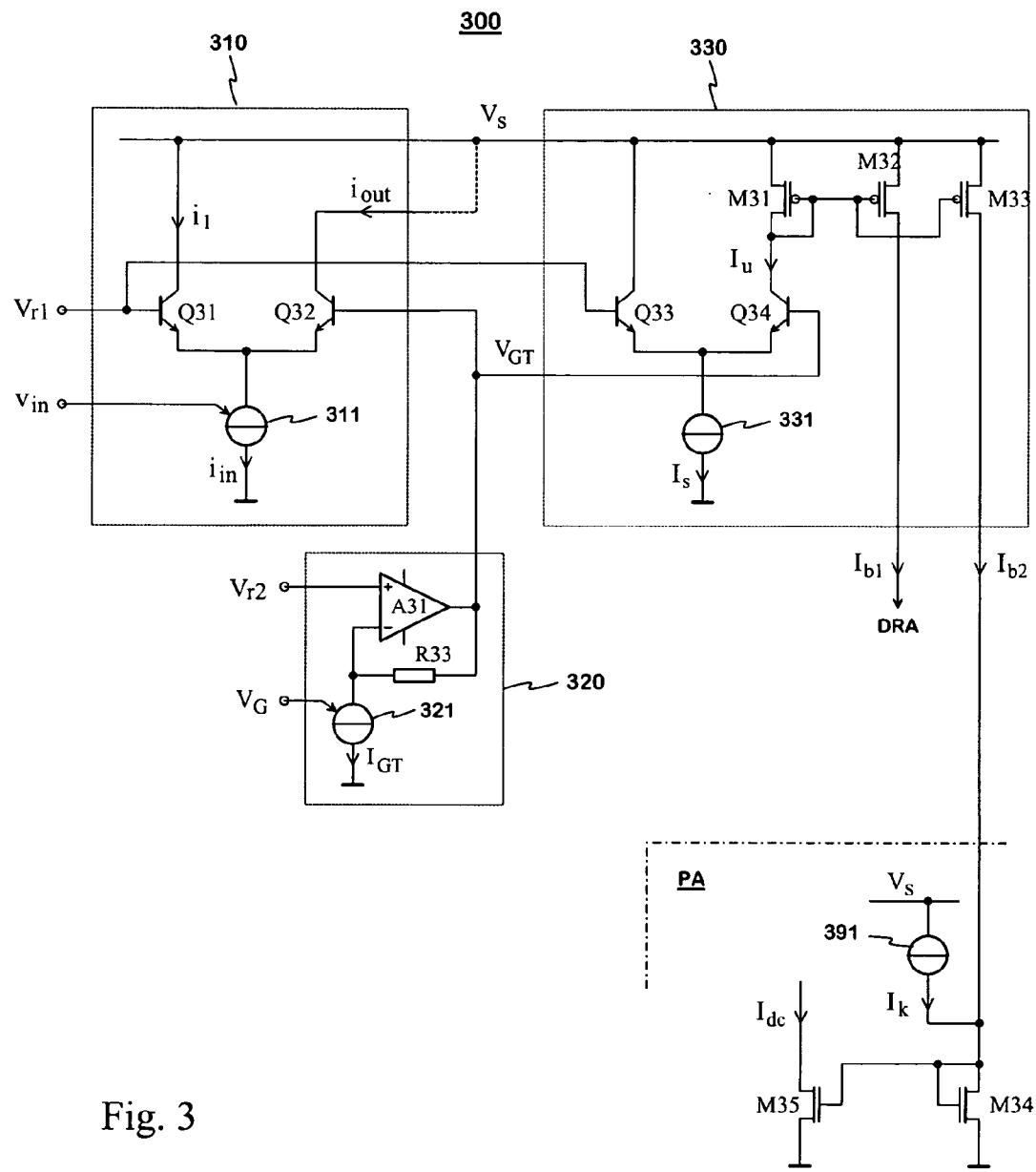
FIG. 3 presents an example of a VGA in accordance with the invention with a bias current source for the transmitter amplifiers.

FIG. 3 shows an example of a VGA according to the invention, having a bias current source for the transmitter amplifiers. The VGA 300 comprises an amplifier proper 310, control circuit 320 thereof and the bias current source 330. The amplifier proper 310 is substantially similar to the amplifier 210 in FIG. 2. It has a bipolar main differential pair Q31–Q32, the emitters of which are connected to a signal current source 311 controlled by the input signal $v_{in}$ of the amplifier. The output signal of the amplifier is the collector current $i_{out}$ of the second transistor Q32. The current gain $G_I$ of the amplifier is $i_{out}/i_{in}$, where $i_{in}$ is the current of the source 311, or the total current of the amplifier 310. The base of the first transistor Q31 is connected to a reference voltage $V_{r1}$ and the base of the second transistor Q32 is connected to the output of the control circuit 320.

The control circuit 320 is similar to the control circuit 220 in FIG. 2. When the input voltage of the control circuit 320, or the gain control voltage $V_G$, is raised, the output voltage $V_{GT}$ of the control circuit rises, whereupon also the current gain $G_I$ becomes greater. If the second reference voltage $V_{r2}$ has been chosen suitably, the current gain can be adjusted almost in the range 0 . . . 1.

The bias current source 330 comprises a differential pair Q33–Q34, the emitters of which are connected to a constant current source 331. The base of the transistor Q33 is connected to a reference voltage $V_{r1}$ and the base of the second transistor Q34 is connected to the output of the control circuit 320. The differential pairs Q31–Q32 and Q33–Q34 then are connected parallel so that they get the same steering. In that case the collector current $I_u$ of the transistor Q34 changes in proportion as the output current $i_{out}$ of the amplifier proper 310 and the current gain $G_I$ when the gain is readjusted. As said differential pairs are manufactured in one and the same process on one and the same substrate, a change in current $I_u$ tracks the change in the current gain very accurately. The accuracy is necessary, if the gain control range is dozens of desibels.

The load of the transistor Q34 is a MOSFET (Metal Oxide Semiconductor Field Effect Transistor) type transistor M31. The bias current source 330 further comprises a second M32 and third M33 MOSFET, each of which forms a so called current mirror circuit with the MOSFET M31. This means that the ratio of both the current $I_{bi1}$ of the second MOSFET M32 and the current $I_{bi2}$ of the third MOSFET M33 to the collector current $I_u$ of the transistor Q34 remains unchanged. The current $I_{bi1}$ is used as the bias current of the driver amplifier DRA and the current $I_{bi2}$ is used as the bias current of the power amplifier PA. FIG. 3 shows an example of the control of the steady current, for the part of the power amplifier. For the control the power amplifier comprises a current mirror circuit formed by MOSFETs M34 and M35. The bias current $I_{bi2}$ is led through the directing MOSFET M34 in the current mirror, whereupon the ratio of current $I_{dc}$ of the MOSFET M35 to the bias current $I_{bi2}$ remains unchanged. The current $I_{dc}$ is used as the steady current of the power amplifier PA. The current mirror is made asymmetric so that the bias current $I_{bi2}$ is substantially lower than the steady current $I_{dc}$, for instance a tenth part of the steady current. In that way the internal currents of the bias current source 330 are made low and the energy consumption caused by the bias current source to be low compared with the energy saving obtained by means of the invention. A low constant current $I_k$ is added to the bias current $I_{bi2}$ in the power amplifier, that the steady current $I_{dc}$ should never get too close to zero.

Figure 4:
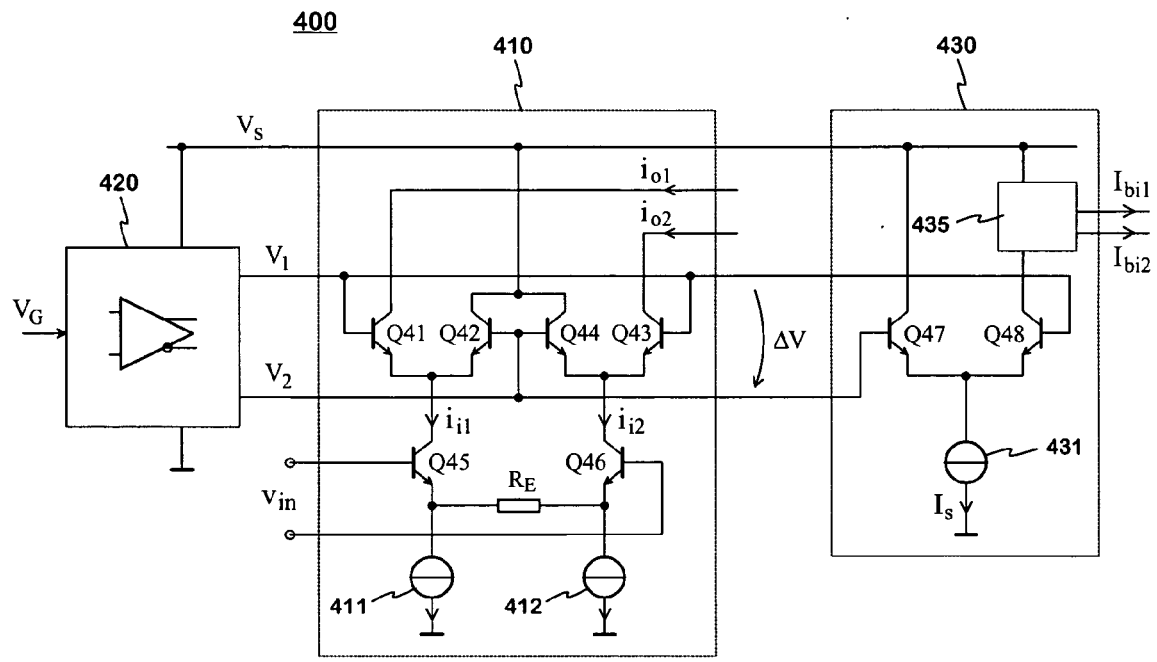
FIG. 4 presents another example of a VGA in accordance with the invention with a bias current source for the transmitter amplifiers.

FIG. 4 shows another example of a VGA according to the invention, having a bias current source for the transmitter amplifiers. Also the VGA 400 comprises an amplifier proper 410, control circuit 420 thereof and the bias current source 430. The amplifier proper 410 is in this example fully differential. It has three differential pairs. The first pair formed by transistors Q41 and Q42 and the second pair formed by transistors Q43 and Q44 are connected parallel such that the bases of the transistors Q41 and Q43 are connected together as well as the bases of the transistors Q42 and Q44. The collectors of the transistors Q42 and Q44 are connected directly to the supply voltage $V_s$. The collectors of the transistors Q41 and Q43 are connected to a load, which consists of the input stage of the following amplifier. The collector current $i_{o1}$ of the transistor Q41 and the collector current $i_{o2}$ of the transistor Q43 are output quantities of the amplifier 410. They are differential: As the one collector current is increasing due to a change in the input signal $v_{in}$ of the amplifier, the other collector current is decreasing.

The third differential pair is formed by the transistors Q45 and Q46. The collector of the transistor Q45 is connected to the emitters of the first pair, thus the current $i_{i1}$ of the transistor Q45 is the same as the total current of the first pair. Correspondingly the collector of the transistor Q46 is connected to the emitters of the second pair, thus the current $i_{i2}$ of the transistor Q46 is the same as the total current of the second pair. The third pair is steered by the input signal $v_{in}$ of the amplifier, which exists between the bases of the transistors Q45 and Q46. A first steady current source 411 is connected between the emitter of transistor Q45 and the ground, and a second steady current source 412 between the emitter of transistor Q46 and the ground. A resistor $R_E$ is connected between these emitters, which resistor affects the base gain of the amplifier.

In FIG. 4 the control circuit 420 is presented only as a symbolic block. The gain control voltage $V_G$ steers an amplifier circuit, which has balanced differential output. The first output terminal, the voltage of which is $V_1$, is connected to the parallel bases of the transistors Q41 and Q43. Correspondingly the second output terminal, the voltage of which is $V_2$, is connected to the parallel bases of the transistors Q42 and Q44. The voltage difference $V_1-V_2=\Delta V$ then controls the current gain in the amplifier 410.

The bias current source 430 is similar to the bias current source 330 in FIG. 3. It comprises a differential pair Q47–Q48, the emitters of which are connected to a constant current source 431. The collector circuit of the transistor Q48 is similar current mirror circuit 435 to that the MOSFETs M31, M32 and M33 form in FIG. 3.

The circuit 435 outputs two bias currents $I_{b1}$ and $I_{b2}$, which change in proportion as the collector current of the transistor Q48. The base of the transistor Q47 is connected to the first output terminal of the control circuit and the base of the transistor Q48 is connected to the second output terminal of the control circuit. The differential pair of the bias current source then is connected parallel to the first and second pairs of the amplifier proper 410 so that all three pairs get the same steering $\Delta V$. In that case the bias currents $I_{b1}$ and $I_{b2}$ change in proportion as the output currents $i_{o1}$ and $i_{o2}$ of the amplifier proper and the current gain when this is read-justed. As said differential pairs are manufactured in one and the same process on one and the same substrate, changes in bias currents track also in this case the change in the current gain very accurately. The bias currents control the steady current of the transmitter power amplifier and of the driver amplifier of the power amplifier. The bias currents as such are also in this case remarkably lower than the steady currents at issue for avoiding losses in the bias current source 430.

Figure 5:
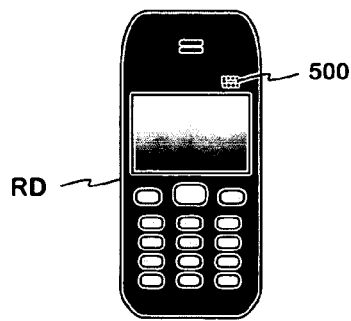
FIG. 5 presents an example of a radio device according to the invention.

FIG. 5 shows an example of a radio device according to the invention. The radio device RD comprises a VGA 500 and an arrangement according to the invention, for saving energy.

Amplifier according to the invention is described above. The invention is not limited only to the depicted structures; the circuit solutions can vary widely. The current saving may be applied also on the VGA itself in addition to the driver and power amplifiers, with the same principle. The inventional idea can be applied in different ways within the scope defined by the independent claim 1.

What is claimed is:

1. An arrangement for saving energy in a radio device transmitter, radio frequency amplifiers of which being at least a VGA and a power amplifier, which VGA comprises at least one main differential pair, total current of which being arranged to be dependent on input signal of the VGA and a collector current of one transistor of the main differential pair being output signal of the VGA, the VGA further comprising a control circuit to change mutual steering of transistors in the main differential pair so that VGA's current gain changes corresponding to changes in a gain control signal, the arrangement comprising in the VGA a bias current source controllable by said gain control signal, output of which bias current source being connected to said power amplifier to make a steady current of the power amplifier dependent on the current gain and thus transmitting power,
wherein;
said bias current source comprises a bias differential pair, the bases of the transistors of which are connected parallel to the bases of the transistors of the main differential pair for steering these pairs by one and the same control signal, and a current of said output of the bias current source is arranged to track in proportion collector current of the transistor of the bias current source, the base of which is parallel with the base of said one transistor of the main differential pair.

2. The arrangement according to claim 1, the bias differential pair and the main differential pair being located on one and the same substrate to equalize the electric characteristics of these pairs.

3. The arrangement according to claim 1, output current of the bias current source being arranged to track in proportion the collector current of the transistor of the bias differential pair by means of a current mirror circuit, a transistor of which is load of said transistor of the bias differential pair and a current of another transistor of the current mirror circuit is output current of the bias current source.

4. The arrangement according to claim 1, the steady current of the power amplifier being arranged to track in proportion the output current of the bias current source by means of a second current mirror circuit, a transistor of which is load of said output of the bias current source and a current of another transistor of the second current mirror circuit is the steady current of the power amplifier.

5. The arrangement according to claim 4, said second current mirror being asymmetric so that the output current of the bias current source is substantially lower than the steady current of the power amplifier to reduce the own losses of the bias current source.

6. The arrangement according to claim 1, the radio device transmitter further comprising a driver amplifier for said power amplifier, wherein;

the bias current source further has a second output, a current of which is arranged to track in proportion the collector current of the transistor of the bias differential pair, the base of which is parallel with the base of said one transistor of the main differential pair, which second output is connected to said driver amplifier to make a steady current of the driver amplifier dependent on the current gain and thus transmitting power.

7. The arrangement according to claim 1, the control circuit of the VGA having a differential output, wherein;

the VGA comprises first and second main differential pairs being parallel such that the bases of first transistors of these pairs are connected to first terminal of the differential output of the control circuit and the bases of second transistors of these pairs are connected to second terminal of the differential output of the control circuit, and said input signal is arranged to be fed to a third differential pair, the collector of first transistor of the third pair being connected to the emitters of the transistors of the first pair and the collector of second transistor of the third pair being connected to the emitters of the transistors of the second pair.

8. A radio device comprising the arrangement as in claim 1.

* * * * *